(12) United States Patent
Dejenfelt et al.

(10) Patent No.: US 6,265,266 B1
(45) Date of Patent: Jul. 24, 2001

(54) METHOD OF FORMING A TWO TRANSISTOR FLASH EPROM CELL

(75) Inventors: Anders T. Dejenfelt, Milpitas; Kameswara K. Rao, San Jose; George H. Simmons, Sunnyvale, all of CA (US); Tomoyuki Furuhata, Nagano-ken (JP)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 08/722,596

(22) Filed: Sep. 27, 1996

(51) Int. Cl.[7] .................................................. H01L 21/336
(52) U.S. Cl. ........................ 438/258; 438/263; 438/266
(58) Field of Search ..................................... 438/257, 258, 438/262, 263, 264, 266, 972

(56) References Cited

U.S. PATENT DOCUMENTS

| | | | |
|---|---|---|---|
| 4,397,077 | * 8/1983 | Derbenwick et al. | 438/264 |
| 4,417,325 | * 11/1983 | Harari | 438/258 |
| 4,822,750 | * 4/1989 | Perlegos et al. | 438/258 |
| 4,833,096 | * 5/1989 | Huang et al. | 438/258 |
| 5,081,054 | * 1/1992 | Wu et al. | 438/258 |
| 5,094,967 | * 3/1992 | Shinada et al. | 438/258 |
| 5,162,680 | 11/1992 | Norman et al. . | |
| 5,329,487 | 7/1994 | Gupta et al. . | |
| 5,379,253 | * 1/1995 | Bergemont | 438/972 |
| 5,397,726 | * 3/1995 | Bergemont | 438/972 |
| 5,453,393 | * 9/1995 | Bergemont | 438/258 |

* cited by examiner

*Primary Examiner*—Charles Bowers
*Assistant Examiner*—Jack Chen
(74) *Attorney, Agent, or Firm*—Bever, Hoffman & Harms LLP; E. Eric Hoffman; Lois D. Cartier

(57) ABSTRACT

A two-transistor flash EPROM cell for high-speed high-density PLD applications is provided. The two-transistor cell includes a storage transistor connected in series to an access transistor. The storage transistor prevents problems associated with both over-erase and punch-through, and allows for scaling of the gate length to realize 5V cell programming.

31 Claims, 9 Drawing Sheets

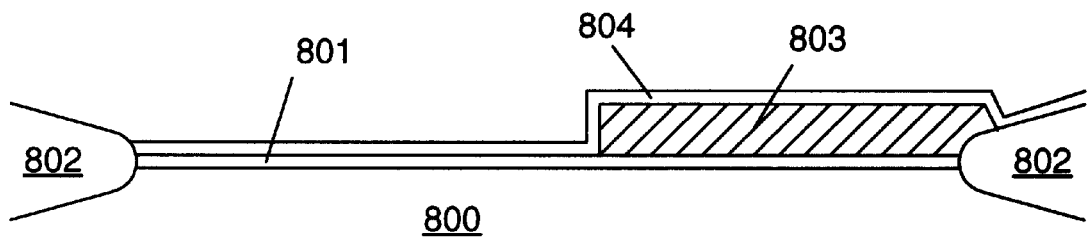
Figure 8B'
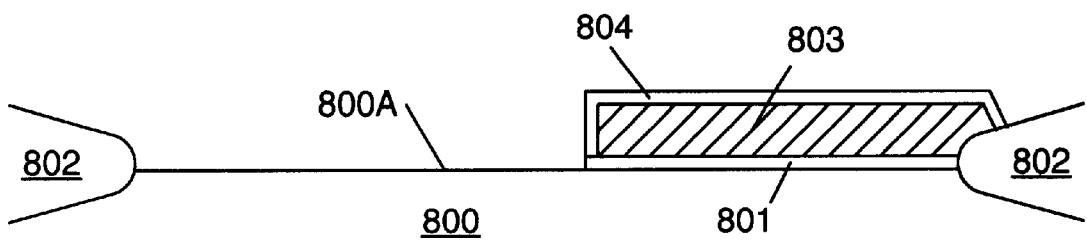
Figure 8B"

METHOD OF FORMING A TWO TRANSISTOR FLASH EPROM CELL

BACKGROUND OF THE INVENTION

1. Field of the Invention

The present invention relates to programmable logic memory cells, and in particular to a memory cell that eliminates problems associated with over erasure in both the read and the program cycles.

2. Description of the Related Art

Electrically erasable programmable read only memory (EEPROM) cells are well known in the art. Referring to FIG. 1, an EEPROM cell 100 includes an access transistor 101 and a storage transistor 102 having a floating gate 103 insulated from but capacitively coupled to a control gate 104. Storage transistor 102 is programmed by Fowler-Nordheim tunneling of electrons from drain D, through a thin oxide region 105, to a floating gate 103. Repeated programming of EEPROM cell 100 results in the trapping of some electrons in the thin oxide region, thereby resulting in a more negative threshold voltage after erasure. In this manner, electron trapping in EEPROM cell 100 eventually renders the cell inoperable.

Flash memory cells are also well known in the art. FIG. 2 illustrates a flash memory cell 200 having a split gate configuration, wherein the access transistor 202 and storage transistor 201 are merged into a single device with a channel region 210 shared by both transistors. Flash memory cell 200 is programmed by hot electron injection from the substrate to floating gate 203, and is erased by Fowler-Nordheim tunneling from floating gate 203, through thin oxide region 205, to drain D. Flash memory cell 200 solves the negative threshold voltage problem of EEPROM 100. Specifically, if the erase threshold voltage of storage transistor 201 becomes negative, the application of zero volts to control gate 204 may turn on storage transistor 201. However, because access transistor 202 is formed in series with storage transistor 201, memory cell 200 has a threshold voltage of approximately 1 volt and therefore as a device does not turn on. Unfortunately, because channel length 210 is not self-aligned during etching, this length may vary from cell to cell. This variation increases programming time as well as the probability of punch through (wherein the drain-source voltage is very high which causes the gate to lose control over the drain current).

Referring to FIGS. 3A and 3B, U.S. Pat. No. 5,329,487, issued to Gupta et al. on Jul. 12, 1994, discloses a prior art flash memory cell 300 which includes a standard floating gate transistor 302 and a merged transistor 304. Merged transistor 304 can be considered a floating gate transistor in series with an NMOS transistor, wherein one edge of a cell selection gate 312 of the NMOS transistor is aligned with a floating gate 311 of the floating gate transistor. The coupling ratio between cell selection gate 312 and floating gate 311 determines the amount of charge transferred to floating gate 311. Therefore, because alignment varies between memory cells, the coupling ratio also undesirably varies, thereby adversely affecting performance of the PLD.

Moreover, Gupta et al. teach providing a common source line 314 for access transistor 312 and storage transistor 311, thereby slowing down the speed of the PLD. Specifically, during logic operation of a PLD, any number of wordlines (WL) in the memory array can be high depending on the logic functions to be implemented in the PLD. Thus, it logically follows that any number of memory cells 300 are simultaneously conducting. The sense amplifiers (not shown), which detect the state of memory cells 300 via their associated bitlines (Read lines), can be pulled down by only one or all memory cells in a column.

To provide a fast response from the sense amplifier even with only one memory cell conducting, the sense amplifier has to be very sensitive, i.e. detecting a voltage drop on the bitline of approximately 50 mV. The maximum bitline drop for one memory cell conducting is 100 mV. On the other extreme, in the event that all memory cells are conducting, the voltage drop on the bitline becomes much more pronounced. Consequently, the time for the bitline to recover to the original state to perform sensing during the next logic state cycle depends strongly on the number of memory cells conducting during the read operation, and the speed of the PLD is limited by the longest possible recovery time. Thus, memory cell 300 fails to achieve the speed and flexibility required for high speed PLD applications.

Therefore, a need arises for a memory cell which eliminates the over-erase problems of the prior art while providing high speed PLD performance.

SUMMARY OF THE INVENTION

In accordance with the present invention, a two-transistor flash cell for high-speed, high-density PLD applications is provided. The two-transistor cell includes a storage transistor, having a floating gate and a control gate, connected in series to an access transistor having a gate. The access transistor eliminates the prior art problems associated with both over-erase and punch-through of the storage transistor, allows for scaling of the gate length of the storage transistor to realize 5V cell programming, and ensures high speed PLD performance.

In one embodiment of the present invention, the drain of the storage transistor (the source of the access transistor) is formed with a high substrate doping. This doping enhances the electric field in the channel region of the storage transistor, thereby dramatically accelerating the transfer of the conduction electrons onto the floating gate during programming. The source of the storage transistor is also formed with a high substrate doping to increase breakdown of the junction, thereby significantly accelerating the transfer of the conduction electrons off the floating gate during erasing. In this manner, during an erase operation, the storage transistor erases to the point that its threshold voltage is negative. Thus, the storage transistor cannot be turned off by its gate. However, the access transistor prevents this over erasure from affecting cell performance. Specifically, because the access transistor is not controlled by the condition of the floating gate, the threshold voltage of the access transistor remains constant. Thus, the access transistor of the present invention eliminates the prior art over erase problem.

In accordance with the present invention, a memory array of flash memory cells are configured such that the drains of the access transistors are coupled to a metal drain line (drain bitline), whereas the sources of the storage transistors are coupled to a metal source line (source bitline). In this configuration, a sense amplifier which receives the voltage on a drain bitline generates a feedback voltage to the source bitline, thereby increasing the voltage on the source bitline during a read operation. In this manner, the drop of the voltage on the drain bitline is slowed down. Consequently, the present invention significantly reduces the time for the bitlines to recover to their original state to perform sensing during the next logic state cycle compared to the prior art memory cell arrays.

Fabricating a flash memory cell in accordance with the present invention includes the following steps. A tunnel oxide layer is first grown on the substrate. A first conductive layer, typically polysilicon, is deposited and patterned on the tunnel oxide layer. Then, a first oxide layer is grown on the polysilicon. This first oxide layer is subsequently removed except for the portion of the first oxide layer in contact with the first conductive layer. A second oxide layer is formed on the portion of the substrate exposed by the step of removing the first oxide. A second conductive layer, typically polysilicon or polycide, is subsequently deposited and patterned to form the control gate of the storage transistor and the gate for the access transistor. The oxide layer and the first polysilicon layer are etched, wherein the etched, first polysilicon layer forms the floating gate of the storage transistor. Note that the control gate and the floating gate are self-aligned, thereby eliminating the process variations of prior art memory cells.

As noted above, the present invention provides that both the source region and the drain region of the storage transistor are highly doped. In one embodiment, the source region is formed by a first N-type implant, for example a Phosphorus implant, and a second N-type implant, for example an Arsenic implant. In this embodiment, the drain region is formed by a first P-type implant, for example a Boron implant, and a second N-type implant, for example an Arsenic implant.

DETAILED DESCRIPTION OF THE DRAWINGS

Figure 1:
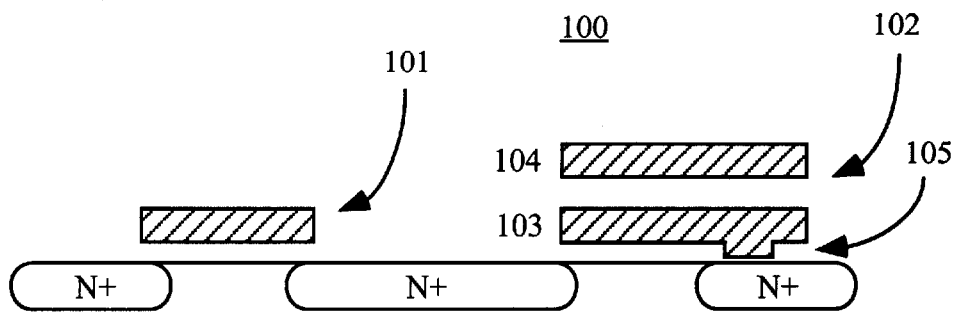
FIG. 1 illustrates a cross-sectional view of a prior art EEPROM cell.
Figure 2:
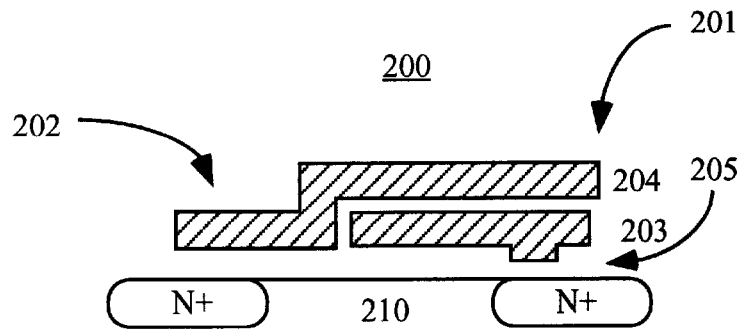
FIG. 2 shows a cross-sectional view of a prior art flash memory cell.
Figure 3A:
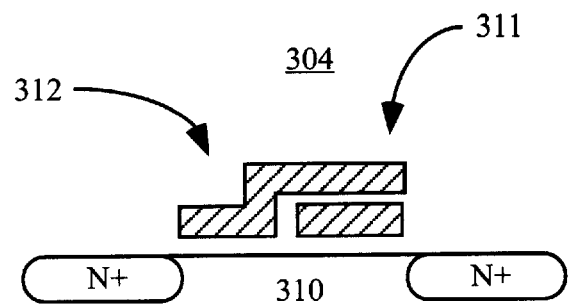
FIG. 3A illustrates a cross-sectional view of a prior art merged transistor.
Figure 3B:
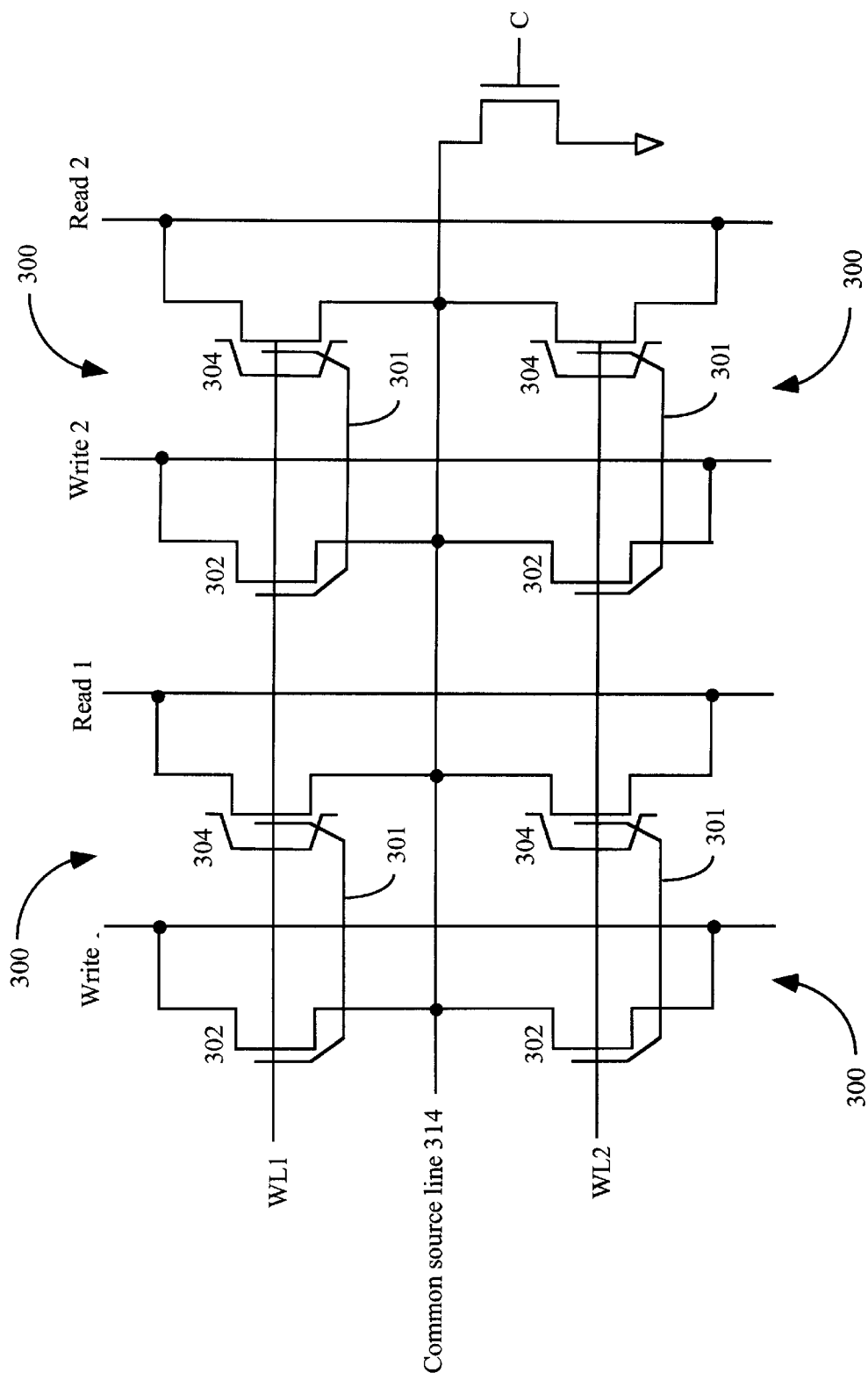
FIG. 3B shows two prior art flash memory cells, each including the merged transistor of FIG. 3A.
Figure 4:
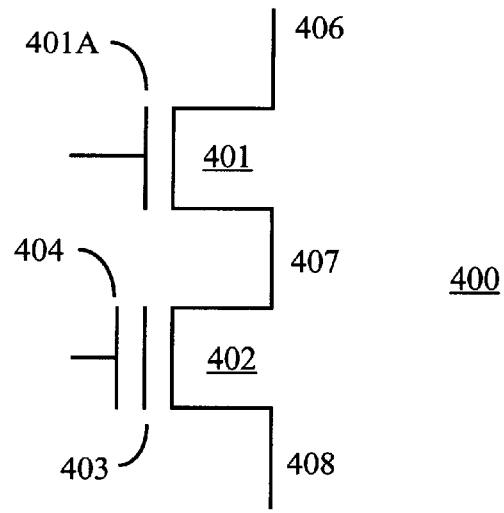
FIG. 4 illustrates a schematic diagram of a flash memory cell in accordance with the present invention.

In accordance with the present invention, FIG. 4 illustrates a schematic view of a flash memory cell 400 having an access transistor 401 and a storage transistor 402. Access transistor 401 has a gate 401A, whereas storage transistor has a floating gate 403 and a control gate 404. In this embodiment, access transistor 401, an N-channel MOSFET, has a threshold voltage of approximately 0.7 volts.

Figure 5:
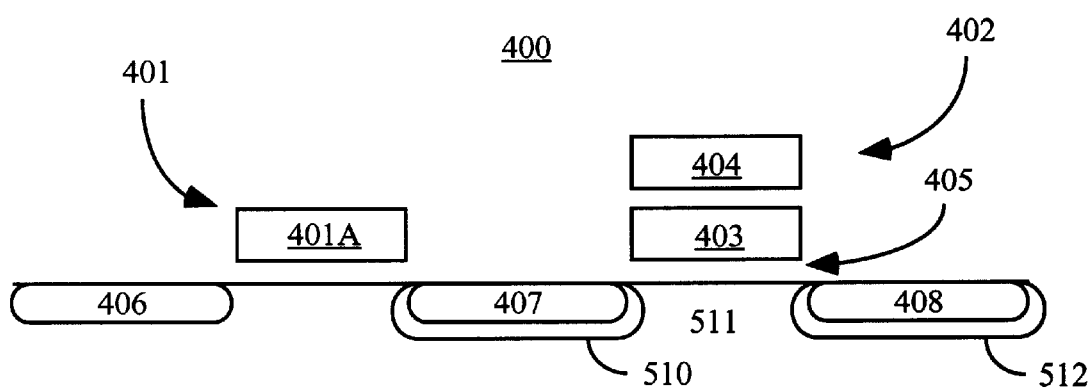
FIG. 5 shows a cross-sectional view of the flash memory cell of FIG. 4.
Figure 8A:
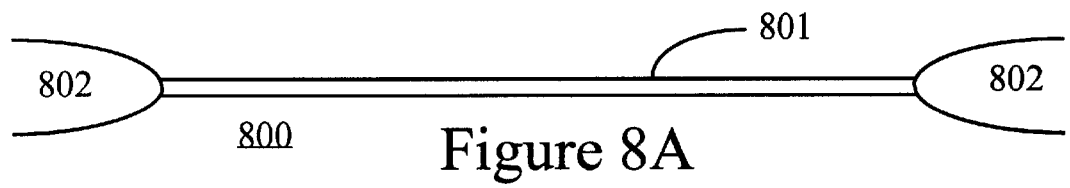
FIGS. 8A–8G illustrate the steps to provide one embodiment of a flash memory cell in accordance with the present invention.
Figure 8B:
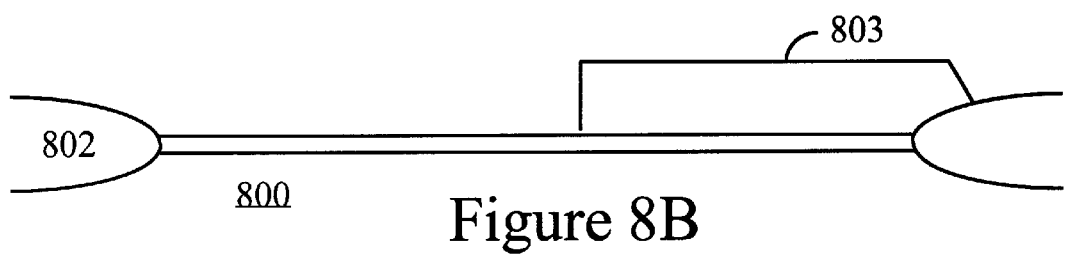
Figure 8C:
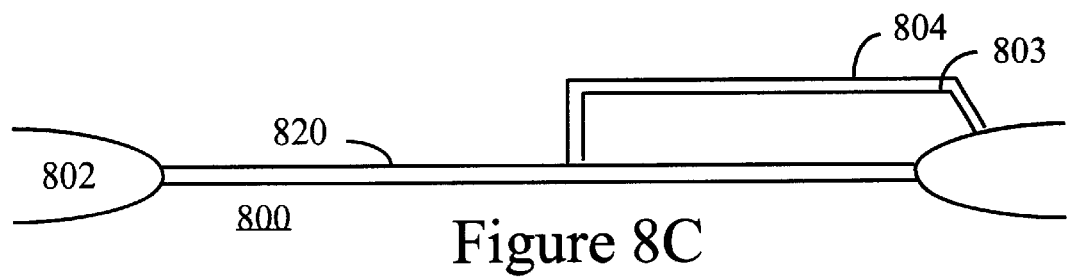
Figure 8D:
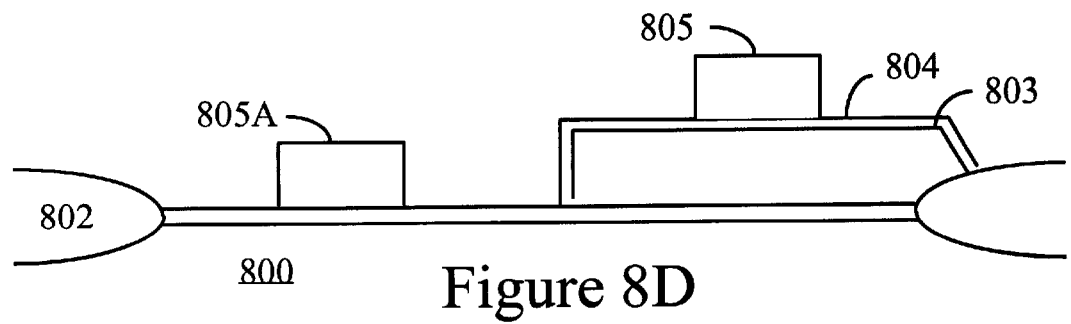

Programming of memory cell 400 is achieved by simultaneously applying a high positive programming voltage Vpp, typically about 12 volts, to gate 401A of access transistor 401 and to control gate 404 of storage transistor 402, holding a source 408 of storage transistor 402 at ground potential Vss, and applying a positive programming pulse to a drain 406 of access transistor 401. In one embodiment, a programming pulse of about 5 volts is provided for 100 micro seconds. Referring to FIG. 5, the drain 407 of storage transistor 402 (also the source of access transistor 401) is formed with a high substrate doping 510 (explained in detail in reference to FIG. 8F). This drain implantation enhances the electric field in the area of channel region 511 close to drain 407, thereby accelerating the conduction electrons and generating a distribution of high energy electrons that are energetic enough to overcome the potential energy barrier for transfer over a thin oxide layer 405 and into floating gate 403 (i.e. hot electron injection). This highly doped drain implant improves the speed of programming by an order of magnitude. Note that access transistor 401 takes up a smaller fraction of the applied drain pulse voltage, since the width of access transistor 401 is typically in the range of 2.0 to 5.0 $\mu$m, compared to 0.5 to 1.5 $\mu$m for storage transistor 402.

Erasing of memory cell 400 is accomplished by applying a high positive voltage Vpp on source 408 of storage transistor 402, while holding control gate 404 to ground potential Vss. A high electric field is generated across thin oxide 405 (FIG. 5), thereby allowing the electrons collected on floating gate 403 to overcome the potential energy barrier and tunnel (i.e. Fowler-Nordheim tunneling) through thin oxide 405 to source 408 of storage transistor 402. During erasing, gate 401A is held at ground and drain 406 is left floating.

Figure 8E:
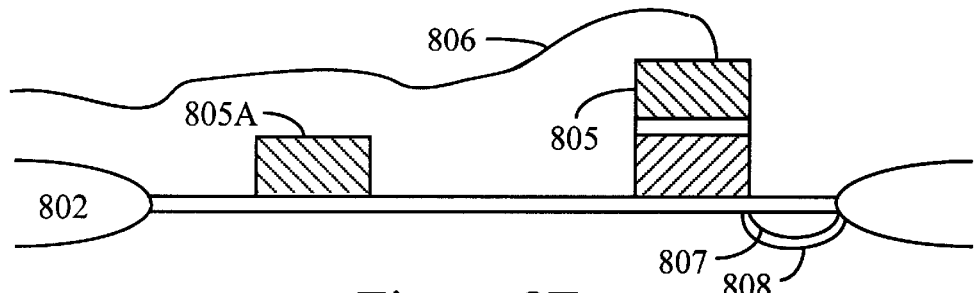
Figure 8F:
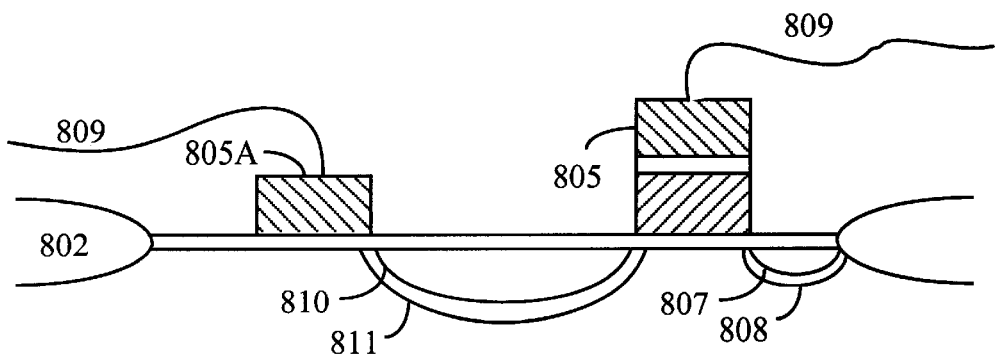
Figure 8G:
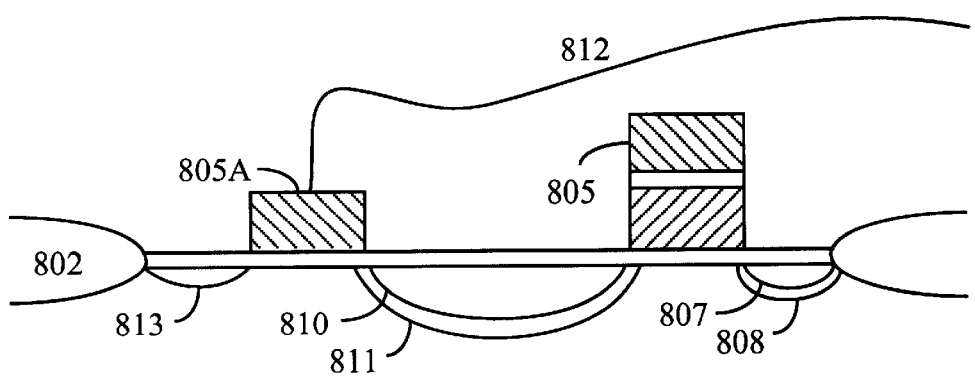

Source 408 of storage transistor 402 is also formed with a high substrate doping 512 (explained in detail in reference to FIG. 8E). This high substrate doping increases the breakdown of the junction, thereby significantly accelerating the transfer of the conduction electrons off the floating gate during erasing. In this manner, during an erase operation, storage transistor 402 erases to the point that its threshold voltage is negative. Thus, storage transistor 402 cannot be turned off by control gate 404. However, access transistor 401 prevents this overerasure from affecting cell performance. Specifically, because access transistor 401 is not controlled by the condition of floating gate 403, the threshold voltage of access transistor 401 remains approximately 0.7 volts.

Figure 6:
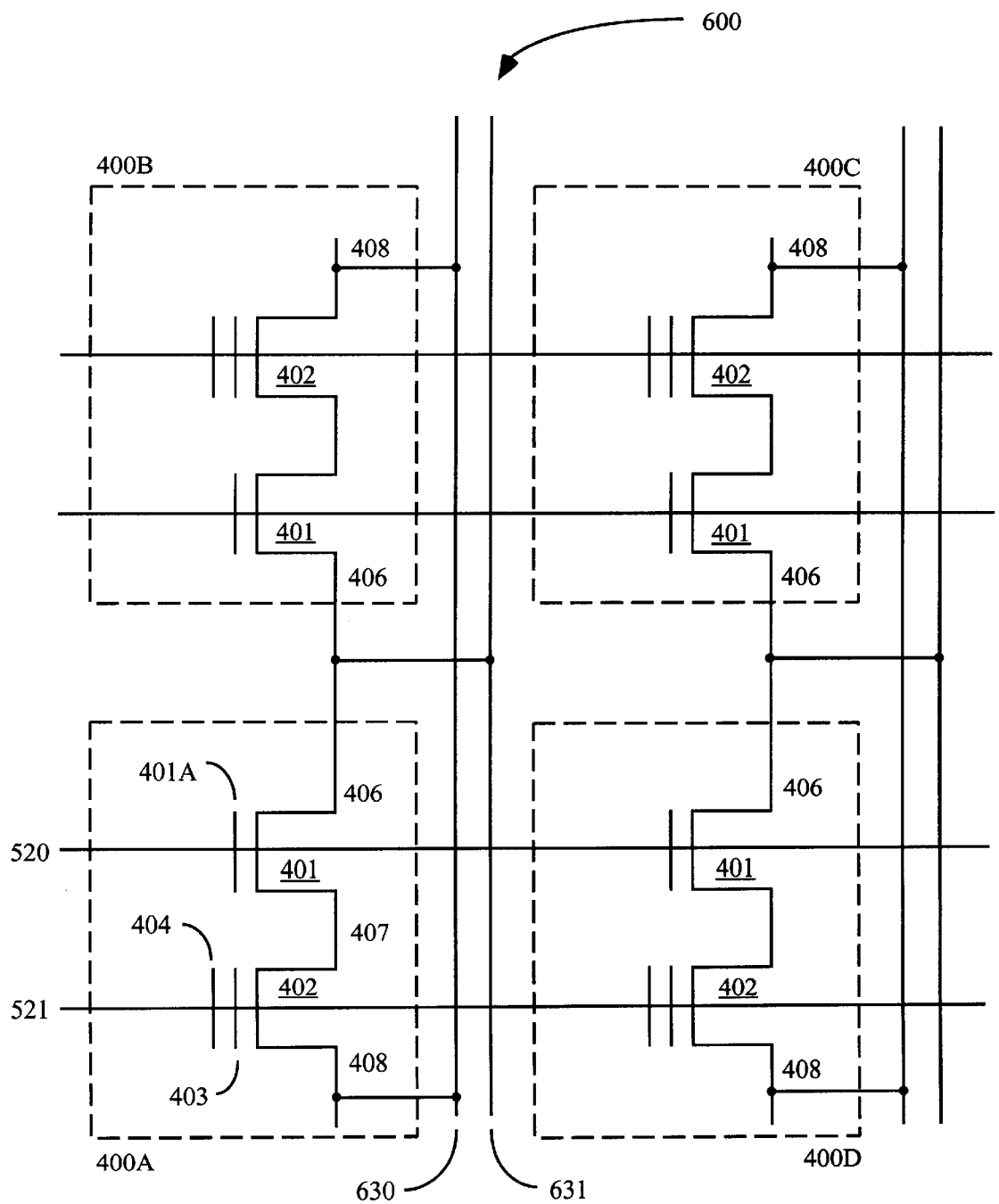
FIG. 6 illustrates a schematic diagram a flash memory cell array in accordance with the present invention.

FIG. 6 shows an illustrative memory array 600 which includes memory cells 400A–400D, wherein each memory cell is identical to memory cell 400 (FIG. 5). The drains 406 of access transistors 401 (of cells 400A and 400B) are coupled to a metal drain bitline 631, whereas the sources of storage transistors 402 (also of cells 400A and 400B) are coupled to a metal source bitline 630. Note that gates 401A of access transistors 401 of cells 400A and 400D are coupled to a wordline 520, whereas control gates 404 of cells 400A and 400D are coupled to a control line 521.

Referring to FIG. 6, reading of a cell 400, for example cell 400A, is accomplished by applying a standard Vcc voltage (typically 5 volts) on gate 401A via wordline 520 and on control gate 404 via control line 521, while simultaneously sensing the read current through cell 400A by a conventional sense amplifier (not shown) connected to drain bitline 631. If cell 400A is erased (i.e. has a zero or net positive charge condition on floating gate 403), both transistors 401 and 402 are turned on, thereby allowing a current to flow that can be sensed by the sense amplifier. If cell 400A is programmed (i.e. has a net negative charge on floating gate 403), the threshold voltage of storage transistor 402 is increased above supply voltage Vcc, thereby preventing current flow through cell 400A.

In this configuration, the sense amplifier which receives the voltages on the drain bitline generates a feedback voltage to source bitline 630, thereby increasing the voltage on source bitline 630 during a read operation. In this manner, the drop of the voltage on drain bitline 631 is slowed down. Consequently, the present invention significantly reduces the time for the bitlines to recover to their original state to perform sensing during the next logic state cycle compared to the prior art memory cell arrays.

The main limitation to scaling of storage transistor 402 is the punch through requirement. Due to capacitive coupling between drain 407 and floating gate 403, storage transistor 402 typically turns on by coupling to drain 407. This capacitive coupling limits the scalability of channel length 511 (FIG. 5) and thereby also limits the improvement in programming speed necessary for 5V programming capability. Specifically, capacitive coupling from drain 407 to floating gate 403 degrades the punch through margin of storage transistor 402. Storage transistor 402 is partially turned on by the voltage induced onto floating gate 403 from drain 407, thereby limiting the drain voltage handling capability of storage transistor 402. The capacitive coupling effect does not scale with the gate line width of storage transistor 402 due to the strong effect of fringing capacitance, i.e. The capacitance other than parallel plate capacitance. Therefore, the effect of this drain coupling actually becomes more dominant for smaller geometries and is a serious scaling limitation to conventional EPROM and flash cells without an access gate. Note that the speed of programming increases exponentially with the inverse of the effective channel length.

The present invention solves this scaling problem by including access transistor 401 (FIG. 5) in cell 400. Because the present invention eliminates punch through on storage transistor 402 in the programming mode, channel length 511 can be scaled. This scalability feature allows channel length 511 to be decreased, thereby significantly increases the programming speed of the memory cell in comparison to the prior art. Moreover, by further including a doping in drain 407, cell 400 achieves a full 5V programming capability.

Figure 7:
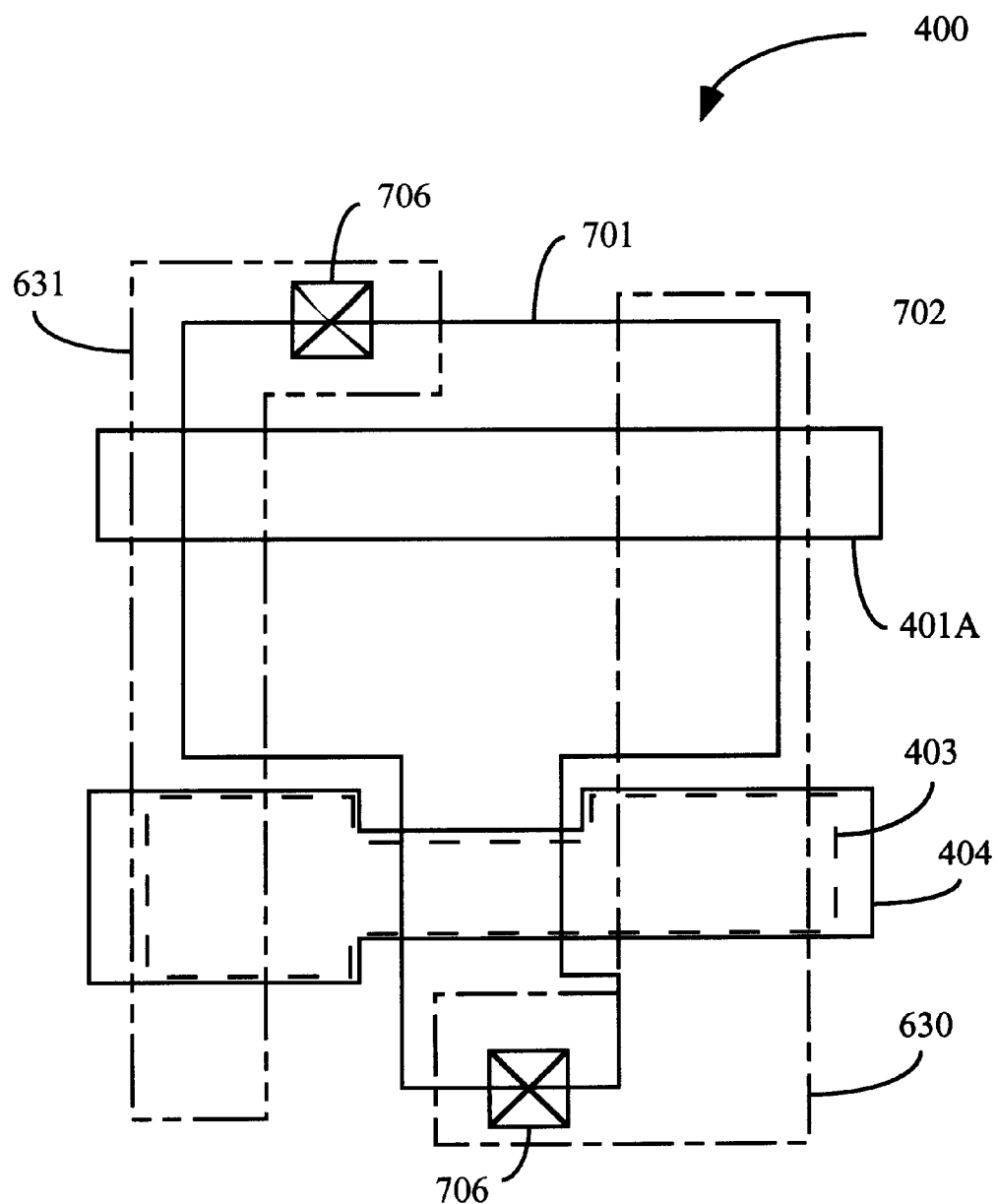
FIG. 7 shows a layout of a flash memory cell in accordance with the present invention.

FIG. 7 illustrates one embodiment of a layout for memory cell 400 including an active diffusion area 701 surrounded by an isolation area 702. Isolation area 702 typically comprises a thick isolation oxide to prevent conduction between adjacent memory cells. A floating gate 403 is self-aligned with a control gate 404 (as described in detail in reference to FIG. 8E). Gate 401A is formed from the same conductive layer used to form control gate 404. After definition of gates 401A, 403, and 404, the junction area is implanted with appropriate dopants to form conventional n-type junctions as well as the source and drain junction implants of the present invention (explained in detail in reference to FIGS. 8E and 8F). Finally, after conventional oxidation steps, contact holes 706 are etched, and metal source line 630 and metal drain line 631 are both deposited and etched. FIGS. 8A–8G illustrate the steps to provide one embodiment of a memory cell in accordance with the present invention. Note that conventional steps and methods are well known to those skilled in the art, and therefore are not described in detail herein. Referring to FIG. 8A, a field isolation region 802 is formed in a substrate 800. Subsequently, a tunnel oxide layer 801 is grown on the exposed area of substrate 800 to a thickness of between 80 Å to 130 Å. FIG. 8B shows that a layer 803 of polysilicon is then deposited and patterned to form the floating gate of the storage transistor. Layer 803 is typically deposited to a thickness of between 1200 Å to 2000Å, and is doped using an N-type dopant, such as Phosphorus Oxychloride ($POCl_3$). Alternatively, another Phosphorous or an Arsenic implant is performed at an energy of 20 to 40 keV and a dosage of $5E14/cm2$ to $5E15/cm2$. An oxide-nitride-oxide (ONO) layer is then provided on the above-described structures as illustrated in FIG. 8B'. Specifically, an oxide layer is grown on the structures to a thickness between 100 Å and 200 Å using a dry oxidation method. A silicon nitride layer is then deposited on the oxide layer to a thickness between 100 Å to 200Å. A final oxide layer is grown to a thickness between 30 Å and 50 Å on the silicon nitride layer using a wet oxidation method. A photoresist layer (not shown) is used to ensure that the resulting oxide-nitride-oxide (ONO) layer 804 is removed except for the storage transistor area, i.e. so that ONO layer 804 is formed only on layer 803 as shown in FIGS. 8B and 8C. This removal typically comprises consecutive steps of wet etching, isotropic etching, and wet etching to reduce any etching damage to the substrate. Subsequently, the gate oxide 820 of the access transistor is grown on the exposed area 800A of the substrate to a thickness of 100 Å to 250Å.

FIG. 8D illustrates the formation of both a control gate 805 for the storage transistor as well as an access gate 805A for the access transistor. Typically, gates 805 and 805A comprise polysilicon or polycide deposited to a thickness between 2500 Å and 4000Å. Polycide may include polysilicon (1200 Å to 2000 Å) in combination with one of the following silicides: tungsten silicide ($WSi_2$), molybdenum silicide ($MoSi_2$), titanium silicide (TiSi), or cobalt silicide ($CoSi_2$) (1000 Å to 2000 Å). Gates 805 and 805A are then doped using an N-type dopant, such as Phosphorus Oxychloride ($POCl_3$), or alternatively, another Phosphorous or an Arsenic implant is performed at an energy of 20 to 40 keV and a dosage of $2E15/cm^2$ to $6E15/cm^2$. Subsequently, gates 805 and 805A are patterned as shown. Using a conventional anisotropic etching method including photoresist, layers 803 and 804 are then etched. In another embodiment, a layer of oxide is formed on the top of gates 805 and 805A to a thickness between 2000 Å and 2500 Å, then another conventional anisotropic etch is performed. Etching using oxide as the photoresist minimizes critical dimension (CD) loss and results in increased control of the shape of the edge of the electrode. In either method, control gate 805 and floating gate 803 of the to-be-formed storage transistor are self-aligned as shown in FIG. 8E. The self-alignment feature of the present invention eliminates the process variations found in prior art memory cells.

Then, a photoresist layer 806 is patterned to selectively expose the source region of the to-be-formed storage transistor. The source region is formed by a first N-type implant 808, in one embodiment a Phosphorus implant at an energy of 50–100 keV and a dosage between $2E14/cm^2$ and $8E14/cm^2$, and a second N-type implant 807, in one embodiment an Arsenic implant at an energy of 40–60 keV and a dosage between $2E15/cm^2$ and $6E15/cm^2$. Both implants are driven in using conventional times and methods. A second photoresist layer 809 is patterned to selectively expose the drain region of the storage transistor (also the source region of the access transistor). The drain region is formed by a first P-type implant 811, in one embodiment a Boron implant at an energy of 20–40 keV and a dosage between $1E13/cm^2$ and $3E13/cm^2_1$, and a second N-type implant 810, in one embodiment an Arsenic implant at an energy of 40–60 keV and a dosage between $2E15/cm^2$ and $6E15/cm^2$. Finally, a third photoresist layer 812 is patterned to selectively expose the drain region of the access transistor. The drain region is formed by a standard N-type implant 813, in one embodiment an Arsenic implant at an energy of 40–60 keV and a dosage between $2E15/cm^2$ and $6E15/cm^2$.

Figure 9:
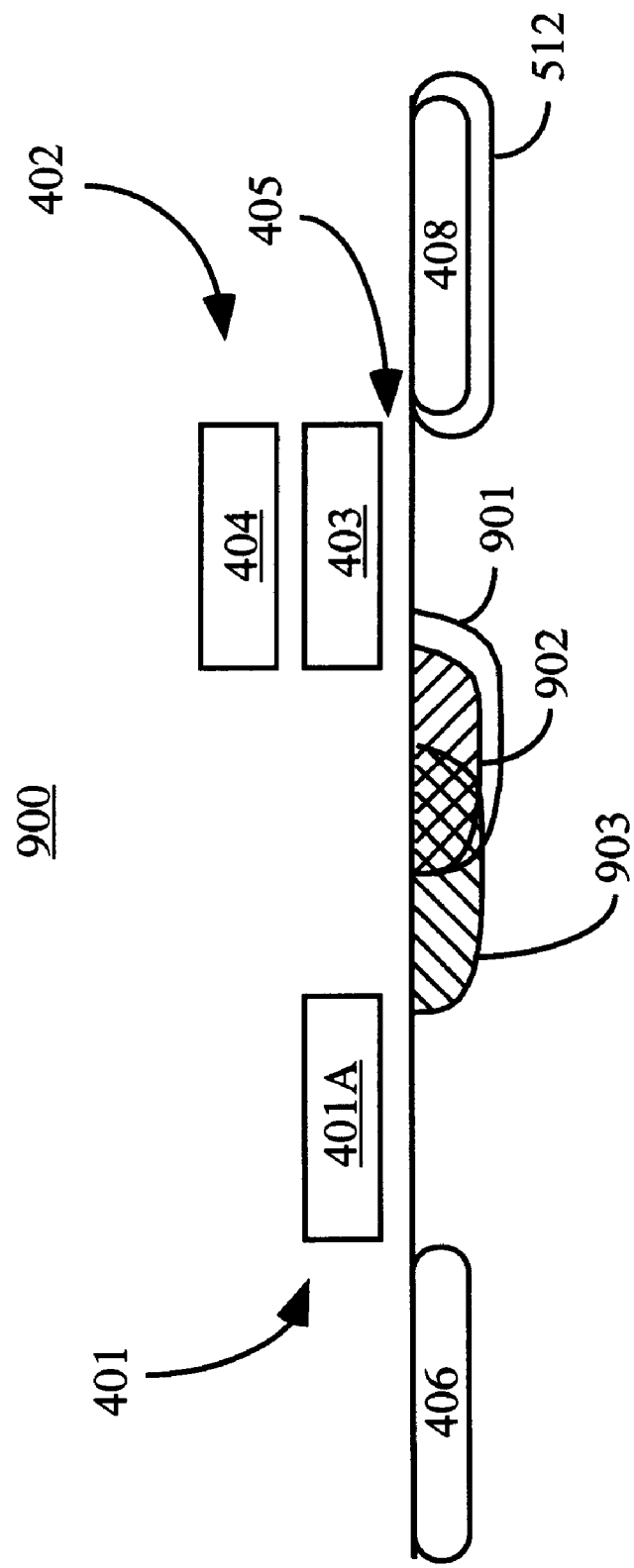
FIG. 9 shows an alternate embodiment of a flash memory cell in accordance with the present invention.

In another embodiment of the present invention shown in FIG. 9, the area defined by the drain of storage transistor 402 and the source of access transistor 401 includes three implants. Implant 903, an N-type implant, extends from under gate 401A on the source side of access transistor 401, but not fully to the drain of storage transistor 402. In one embodiment, this N-type implant includes an Arsenic implant at an energy of 40–60 keV and a dosage between $2E15/cm^2$ and $6E15/cm^2$. Implant 902, another N-type implant, extends from the drain of storage transistor 402 to some portion of the source of access transistor 401, thereby overlaping implant 903. In one embodiment, this N-type implant includes an Arsenic implant at an energy of 40–60 keV and a dosage between $2E15/cm^2$ and $6E15/cm^2$. Implant 901, a P-type implant, extends from under gate 403 on the drain side of storage transistor 402, but not fully to the source of access transistor 401. In one embodiment, this P-type implant includes a Boron implant at an energy of 20–40 keV and a dosage between $1E13/cm^2$ and $3E13/cm^2$. Note that in one embodiment, only two masks are required: one mask to form implants 901 and 902, and another mask to form implant 903. Providing implants 901–903 allows the performance of access transistor 401 and the storage transistor 402 to be optimized separately, thereby even further increasing the speed of the PLD.

The present invention which includes both access transistor 401 (FIG. 4) and storage transistor 402 provides many advantages. First, the erasing of storage transistor 402 may leave memory cell 400 with a negative threshold voltage, thereby causing leakage and eventually rendering the circuit inoperable. With access gate 401, memory cell 400 does not conduct current even if the erased threshold voltage of storage transistor 402 becomes negative. As known by those skilled in the art, the erased threshold voltage can vary over the lifetime of the device and over the population of the memory cells in the device and may be difficult to control. Thus, control of the erased threshold voltage is of major concern for high density flash memory devices. With access transistor 401 of the present invention, this problem is totally eliminated.

Second, with an access transistor included in each memory cell, each bitline can have a separate source metal connection. The sense amplifier design can take advantage of this connection by providing a source bias voltage that limits the voltage drop incurred on the drain bitline during sensing. This sense amplifier feedback is active in cases where a large number of memory cells are conducting, thus pulling the drain bitline strongly to voltage source Vss (ground). The time to recover from a low bitline drain voltage, back to the original bitline voltage to a new sensing cycle, depends on the bitline voltage after sensing. By using this source feedback technique, the present invention significantly limits the recovery time, even for large variations of the number of memory cells active during a read operation.

Third, punch-through in the memory cell from drain to source causes leakage in unselected memory cells during programming. The accumulated leakage from all memory cells connected to the same bitline can reach levels where the drain voltage available to program the selected memory cell is limited by the voltage drop in the bitline select logic load line, thereby causing the programming time for the selected cell to increase. For EPROM and flash cells without access gates, the punch through concern is normally what limits the cells' gate length on the short side. The punch through voltage is lower for a floating gate device, compared to a standard MOS device because of the capacitive coupling of the high drain voltage onto the floating gate of the cell. By this coupling, the effective floating gate voltage may increase until the transistor starts to conduct by normal inversion-channel turn-on of the device, as opposed to sub-surface punch through seen in a normal MOS transistor. The capacitive coupling does not scale with the scaling of the gate channel length, making this effect the limitation to scaling of floating gate devices. With the access transistor included in the memory cell of the present invention, the punch through voltage is taken up by the access gate, and the channel length of the storage transistor can be scaled down until read-disturb becomes the limitation. This means that the target channel length of the storage transistor can be lowered, thus providing (i) higher read currents and faster sensing in logic operation, and (ii) increased speed of programming. The speed of programming increases exponentially with lower channel length.

Fourth, in accordance with the present invention, the control gate and the access gate are independent of one another. In the read mode, all the control gates are set at 5V and the selected access gate is taken from 0V to 5V. In this manner, the capacitance of the memory bit is advantageously not coupled to the associated bit line.

The present invention slightly increases the memory cell area. However, because the memory area in a PLD is a minor portion (approximately 20%) of the total chip area, which is dominated by high speed logic, the increase in memory cell area is negligible.

The above embodiments are illustrative only and not limiting. Other embodiments of the present invention will be apparent to those skilled in the art and will fall within the scope of the present invention which is defined by the appended claims.

We claim:

1. A method of forming a flash memory cell including a storage transistor and an access transistor comprising:

providing a tunnel oxide layer on a substrate;

depositing and patterning a floating gate on said tunnel oxide layer;

providing a dielectric layer over said floating gate;

removing said dielectric layer except for the portion of said dielectric layer located over said floating gate;

removing a portion of said tunnel oxide layer that is not under said floating gate, whereby a portion of said substrate is exposed;

forming a gate oxide layer over the exposed portion of said substrate; and depositing and patterning a conductive layer to form a control gate for said storage transistor over said dielectric layer, and a gate for said access transistor over said gate oxide layer.

2. The method of claim 1 further comprising the step of forming a field isolation region in said substrate.

3. The method of claim 1 wherein the thickness of said tunnel oxide layer is between approximately 80 Å and 130 Å.

4. The method of claim 1 wherein said floating gate comprises polysilicon.

5. The method of claim 4 wherein said floating gate is deposited to a thickness between approximately 1200 Å and 2000 Å.

6. The method of claim 4 wherein said polysilicon is doped using an N-type dopant.

7. The method of claim 6 wherein said N-type dopant includes one of Phosphorous, and Arsenic.

8. The method of claim 1 wherein said dielectric layer comprises an oxide-nitride-oxide (ONO) layer.

9. The method of claim 8 wherein said ONO layer is provided to a thickness range of approximately 250 Å to 380 Å.

10. The method of claim 1 wherein said gate oxide layer is formed to a thickness between approximately 100 Å and 250 Å.

11. The method of claim 1 wherein said conductive layer comprises one of polysilicon and polycide.

12. The method of claim 11 wherein said polycide comprises one of tungsten silicide ($WSi_2$), molybdenum silicide ($MoSi_2$), titanium silicide (TiSi), and cobalt silicide ($CoSi_2$).

13. The method of claim 11 wherein said conductive layer is doped using a dopant.

14. The method of claim 13 wherein said dopant comprises one of Phosphorous and Arsenic.

15. The method of claim 1 further comprising a step of doping a region of said substrate with a first implant and a second implant.

16. The method of claim 15 wherein said first implant comprises an N-type implant.

17. The method of claim 16 wherein said N-type implant comprises a Phosphorus implant.

18. The method of claim 15 wherein said second implant comprises an N-type implant.

19. The method of claim 18 wherein said N-type implant comprises an Arsenic implant.

20. The method of claim 15 wherein said first implant comprises a P-type implant.

21. The method of claim 20 wherein said P-type implant comprises a Boron implant.

22. The method of claim 20 wherein said second implant comprises an N-type implant.

23. The method of claim 22 wherein said N-type implant comprises an Arsenic implant.

24. The method of claim 1 further comprising a step of doping a region of said substrate with an N-type implant.

25. The method of claim 24 wherein said N-type implant comprises an Arsenic implant.

26. The method of claim 1, further comprising the step of etching said dielectric layer and said floating gate such that said floating gate is self-aligned with said control gate.

27. The method of claim 1, further comprising a step of doping a region of said substrate using an implant dose of $2E15/cm^2$ to $6E15/cm^2$ to form a source region for said storage transistor.

28. The method of claim 1, further comprising a step of doping a region of said substrate using an implant dose of $2E15/cm^2$ to $6E15/cm^2$ to form a drain region for said storage transistor.

29. The method of claim 28, wherein said step of doping simultaneously forms a source region of said access transistor.

30. The method of claim 28, further comprising a step of doping another region of said substrate to form a drain region of said access transistor.

31. The method of claim 11 wherein said conductive layer is deposited to a thickness between approximately 2500 Å and 4000 Å.

* * * * *